US005556477A

United States Patent [19]

Nähring et al.

[11] Patent Number: 5,556,477
[45] Date of Patent: Sep. 17, 1996

[54] TRANSPORT DEVICE FOR SUBSTRATES TO BE COATED IN A VACUUM COATING SYSTEM

[75] Inventors: Herbert Nähring, Rodenbach; Hans Wolf, Erlensee; Jürgen Mulderer, Alzenau, all of Germany

[73] Assignee: Leybold Aktiengesellschaft, Hanau, Germany

[21] Appl. No.: 449,676

[22] Filed: May 24, 1995

[30] Foreign Application Priority Data

Jun. 9, 1994 [DE] Germany .......................... 44 20 113.3

[51] Int. Cl.[6] .............................. C23C 16/00; C23C 14/56
[52] U.S. Cl. ..................... 118/728; 118/500; 118/503; 118/729; 204/298.15; 204/298.23
[58] Field of Search ..................... 118/728, 729, 118/500, 503; 204/298.15, 298.23, 298.24, 298.25, 298.26; 269/55, 77, 289 MR, 900, 903

[56] References Cited

U.S. PATENT DOCUMENTS

| | | | |
|---|---|---|---|
| 4,317,427 | 3/1982 | Turner | 118/503 |
| 4,473,455 | 9/1984 | Dean | 204/298.15 |
| 4,647,266 | 3/1987 | Coad et al. | 414/225 |
| 4,847,119 | 7/1989 | Chin | 427/282 |
| 4,919,076 | 4/1990 | Lutz | 118/721 |
| 4,971,676 | 11/1990 | Doue | 204/297 R |
| 4,978,412 | 12/1990 | Aoki | 156/345 |
| 5,124,019 | 6/1992 | Kunkel | 204/298.15 |
| 5,192,087 | 3/1993 | Kawashima | 279/71 |
| 5,393,349 | 2/1995 | Ohkase | 118/725 |

FOREIGN PATENT DOCUMENTS

| | | | |
|---|---|---|---|
| 54-101258 | 9/1979 | Japan | 118/728 |
| 60-81820 | 5/1985 | Japan | 118/728 |
| 62-23102 | 1/1987 | Japan | 118/728 |
| 4-289168 | 10/1992 | Japan | 118/728 |
| 5-254985 | 10/1993 | Japan | 204/298.15 |
| 6-73541 | 3/1994 | Japan | 118/728 |

Primary Examiner—Robert Kunemund
Assistant Examiner—Jeffrie R. Lund
Attorney, Agent, or Firm—Felfe & Lynch

[57] ABSTRACT

A substrate carrier plate (17, 17a) designed to hold at least one substrate is removably attached to a support element (19, 19a) of a base (2). The carrier plate is held to the support element (19, 19a) at least at one point by a centering pin (22, 23; 22a, 23a), which projects from the plate of the support element (19) and fits into a hole (24, 25) in the substrate carrier plate (17), and at least at one other point by a clamping device (18, 18a). The clamping device (18, 18a) is held on a control part (11) on the base (2) in such a way that it can be moved by the displacement of an actuating arm (21) between a clamping position and a release position, and it is also provided with a tensioning roller (14), which is supported on a ramp (15, 15a) on the substrate carrier plate (17). The substrate carrier plate (17) has an opening (20, 20a) to allow the passage of the tensioning roller (14), the tensioning roller (14, 14a) being located behind this opening when in its release position. A kickover spring (9) holds the tensioning rollers (14, 14a) under pretension in one stable position when in the tensioning position and under pretension in another stable position when in the release position.

17 Claims, 2 Drawing Sheets

TRANSPORT DEVICE FOR SUBSTRATES TO BE COATED IN A VACUUM COATING SYSTEM

BACKGROUND OF THE INVENTION

The invention pertains to a transport device for substrates to be coated in a vacuum coating system with a substrate carrier plate removably attached to a support element of a base, the carrier plate being designed to hold at least one substrate.

Transport devices of the type described above are currently used in cathodic sputtering systems to transport the substrates to be coated to the individual treatment stations of the system and to hold them there during processing. Because the transport devices in a cathodic sputtering system are subjected to high temperatures, because a high vacuum prevails in such systems, and because no contaminants may be allowed to the enter the system with the transport devices, these devices must meet very stringent requirements. The transport devices may not have any parts which cannot withstand the high temperatures in the system or which could carry along gases which would then be released in the system and interfere with the coating process. It is also very important that the transport devices not have any moving parts which could produce abrasion, because the generation of particles thus induced would make it impossible in most cases to obtain a good coating. Because the transport devices with the substrates must be transferred into the various chambers of the coatings system through locks, they should be as narrow as possible so that the cross section of the locks can be kept small.

Up to now, the transport devices have been designed in such a way that a substrate carrier plate could be attached to each of the two sides by hand. If it is desired to accomplish the loading process automatically by means of a robot, however, the substrate carrier plates must be pivoted from a horizontal position, in which they are loaded with the substrates, into a vertical position and then moved transversely to their long direction toward the support elements and fastened to the support elements. The motions required for this process should be as simple as possible. The transport device may not be provided with any devices for the docking with the support elements which do not meet the requirements described above, i.e., which cannot withstand high temperatures, which could bring air into treatment chambers under high vacuum, or which could produce abrasion during clamping motions and thus introduce contaminants into the system.

SUMMARY OF THE INVENTION

The invention is based on the task of designing a transport device of the general type described above in such a way that it can be loaded and unloaded automatically with the minimum of effort and so that it will meet the requirements of inward transfer into vacuum coating systems.

This task is accomplished by clamping the substrate carrier plate against the support element at least at one point by means of a centering pin, which projects from the plane of the support element and fits into a hole in the substrate carrier plate, and at least at one other point by means of a clamping device. The clamping device is mounted in such a way on the base, on a control part, that it can be moved by an actuating arm between a clamping position and a release position, the clamping device being provided with a tensioning roller, which is supported on a ramp of the substrate carrier plate, the substrate carrier plate having an opening to allow the passage of the tensioning roller, behind which opening the tensioning roller is located when in its released position. The ramp leads away from this opening in the direction in which the tensioning roller travels, the distance between the ramp and the support element increasing with increasing distance from the opening.

A transport device such as this can be loaded and unloaded very easily by a robot automatically, because the substrate carrier plates can be clamped in position simply by sliding the actuating arm in one direction or the other. Because the clamping device travels by a roller over a ramp on the substrate carrier plate, there is no abrasion during the clamping operation which could interfere with the processes in the treatment chambers. The opening in the substrate carrier plate makes it possible for this plate to be pushed axially up as far as the support element without the tensioning roller being in the way. During the clamping motion, as the tensioning roller is rolling along the ramp, the substrate carrier plate cannot slip, because it is held in position by the centering pin.

The invention, the clamping device can be held positively either in the clamping position or in the released position by connecting the control part to a kickover spring, by means of which the control part, after it has overcome an unstable intermediate position, is held under pretension in the clamping position or release position. In an embodiment such as this, the actuating arm does not need to be moved all the way to an end position to bring about a complete clamping process or a complete release process.

A very easy way to design the kickover spring and to install it in the transport device is to make it in the form of a leaf spring, to bend it into an arc, and to clamp its two ends between two bearings.

If each of these bearings has a V-block to receive one end of the kickover spring, made in the form of a leaf spring, the kickover spring can be inserted together with the control part in the base without tools.

If, in accordance with another elaboration of the invention, a bearing is provided which is able to slide in the main direction of the kickover spring, this bearing being pretensioned by means of a lateral-yield spring in the main direction of the kickover spring, it is possible to prevent undesirable stress on the kickover spring as it passes through its neutral, intermediate position.

The kickover spring can be combined into a single component with the control part and mounted as a unit, if the control part is designed as a rocker arm, which rests on the kickover spring near one end of the spring, and to which a support plate is screwed from the opposite side of the kickover spring to fasten the kickover spring. This type of connection works without any abrasion.

If the bearings are designed as separate components which can be inserted into the base, they can be made of a hard, abrasion-resistant material, and the base can be made of a light-weight, easy-to-process material. As a result, it is possible to replace the bearings cheaply even if they do become worn.

If the opening and the ramp are provided on a tensioning element, which is inserted into the substrate carrier plate and which is provided with a retaining flange, the ramp, too, can be made of a material with the optimum behavior with respect to the rolling of the tensioning roller.

If the transport device according to the invention has a support element with a removable substrate carrier plate, a centering pin, and a clamping device on both sides in a symmetrical arrangement, it will be able to transport two substrate carrier plates simultaneously.

The transport device for two substrate carrier plates can be made with an extremely small number of parts by providing it with a single control part, held by a kickover spring; by installing the control part on the base between the two carrier elements; and by providing the control part with a clamping yoke, which carries a tensioning roller on the outside surface of each substrate carrier plate, this roller being designed to roll along the associated ramp.

So that a robot can easily actuate the control part, it is advisable for the kickover spring and the control part to be aligned with the longitudinal direction of the transport device and for the actuating arm to point in or opposite the direction of travel when it shifts the control part.

If the transport device is relatively long in order to accommodate the length of the substrate carrier plates, then the substrate carrier plates can be connected to the transport device at one end by means of a fixed bearing and at the other end by means of a movable bearing. This is done by attaching a base component, which carries the support elements, the tensioning element, and the associated parts, to each end of the transport device. The support elements of one base are permanently screwed to the transport device, whereas the support elements of the other base are held by slots in the base so that they can slide relative to the transport device in the longitudinal direction.

The invention can be implemented in many different ways. To provide a further explanation of its basic principle, one such implementation is shown in the drawings and described below.

DETAILED DESCRIPTION OF THE PREFERRED EMBODIMENT

Figure 1:
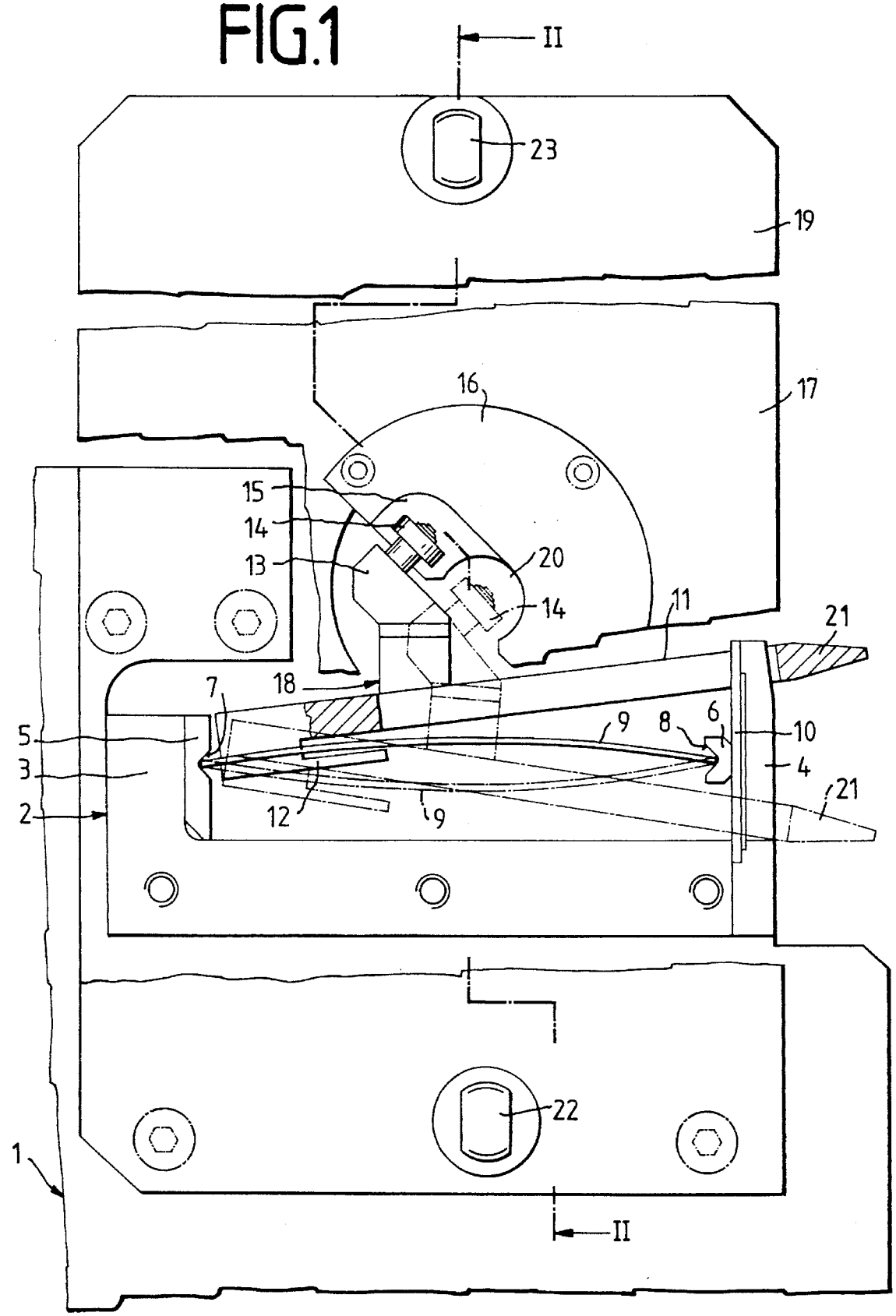
FIG. 1 shows a side view of an area of the transport device essential to the invention.

FIG. 1 shows a part of a transport device 1, which is able to move on fixed, driven rollers (not shown) between various stations of a vacuum coating system. Transport device 1 has a U-shaped base 2, each of the upward-pointing shanks 3, 4 of which has a bearing 5, 6. Each of bearings 5, 6 has a V-block 7, 8, these V-blocks being aligned with and directed toward each other. One end of a kickover spring 9 is braced in each of these V-blocks 7, 8, the spring being in the form of a leaf spring, which, when in the clamped position, is bent into an arc. Whereas bearing 5 is permanently joined to base 2, bearing 6 is able to move toward the right, relative to the main direction of kickover spring 9 in FIG. 1, in that it is attached to a lateral-yield spring 10, which bends elastically to the right in a corresponding manner.

A control part 11, designed as a rocker arm, is attached by means of a support plate 12 to kickover spring 9. Control part 11 rests from above on kickover spring 9, near the end on the left in FIG. 1, whereas support plate 12 grips kickover spring 9 from below and is screwed to control part 11, so that kickover spring 9 is clamped in this area between control part 11 and support plate 12.

Control part 11 has an upward-pointing clamping yoke 13 with a tensioning roller 14, which, in the tensioning position shown, is supported on a ramp 15 of a tensioning element 16 of a substrate carrier plate 17. Tensioning roller 14 forms together with clamping yoke 13 and ramp 15 a clamping device 18, by means of which substrate carrier plate 17 can be clamped against a support element 19, shown cut away above it. Tensioning element 16 has an opening 20, from which ramp 15 proceeds upward at an angle.

To actuate clamping device 18, control part 11 has a forward-pointing actuating arm 21. When this is pressed down, kickover spring 9 first overcomes a neutral position and then snaps out of the upward-curved position shown in solid lines into the downward-curved position shown in phantom. In this down-curved position, tensioning roller 14 is lined up with opening 20, so that substrate carrier plate 17 can then be pulled away from support element 19 located behind it.

Figure 2:
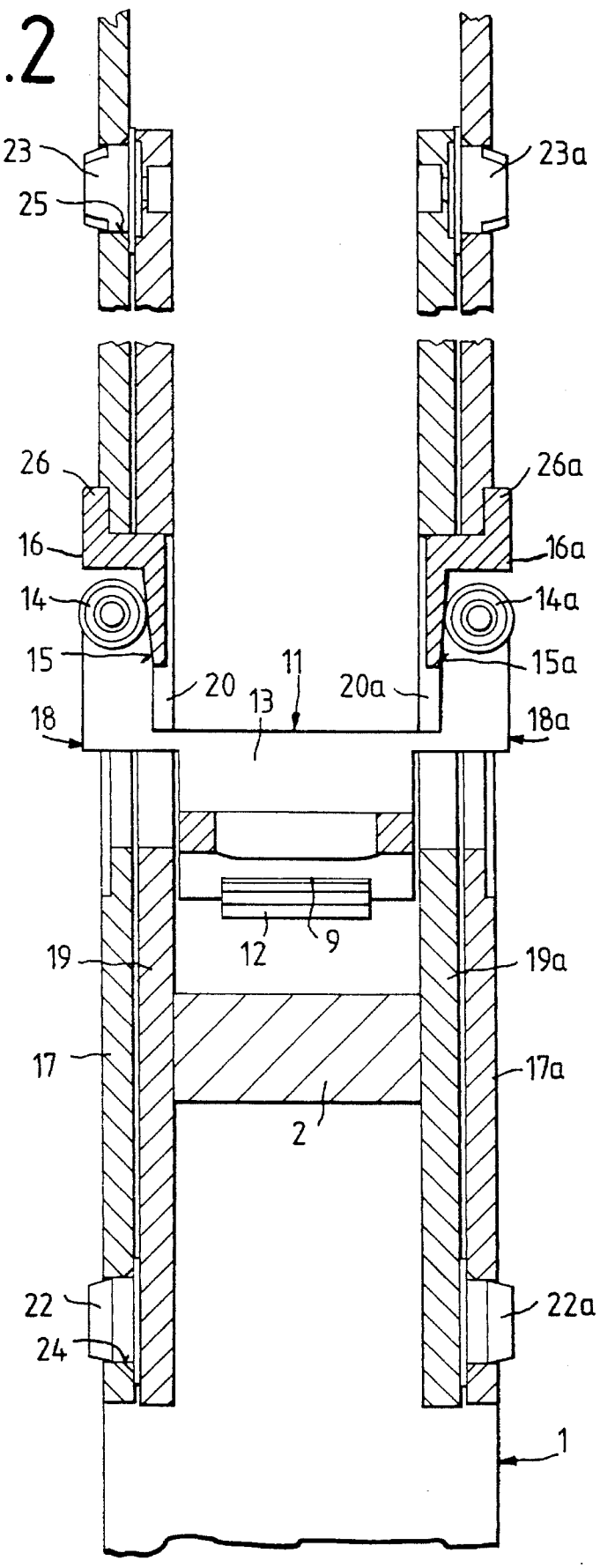
FIG. 2 shows a vertical cross section through the transport device along line II—II of FIG. 1.

So that substrate carrier plate 17 can be positioned on support element 19, support element 19 has centering pins 22, 23, which fit into matching recesses 24, 25 of substrate carrier plate 17 shown in FIG. 2.

FIG. 2 shows that transport device 1 has a symmetric design and that base 2 is bounded on both sides by support elements 19, 19a, to which in each case a substrate carrier plate 17, 17a can be clamped. It can be seen that tensioning elements 16, 16a are inserted into these substrate carrier plates 17, 17a, and in each case their retaining flanges 26, 26a grip around these substrate carrier plates 17, 17a from the outside. FIG. 2 also shows the two ramps 15, 15a, on each of which a tensioning roller 14, 14a is supported.

It is not shown that, to hold substrate carrier plates 17, 17a a base 2 can be provided with support elements 19, 19a and the other components on each side of transport device 1. Base 2 in any case forms a unit permanently screwed to the two support elements 19, 19a. This unit can be designed either as a fixed bearing or as a movable bearing. If it serves as a movable bearing, then the two support elements 19, 19a are screwed to transport device 1. Conversely, the movable bearing side is designed so that the two support elements 19, 19a are connected to each other by bolts, when are seated in correspondingly designed slots in transport device 1, to allow the longitudinal displacement required by the thermal expansion of the substrate carrier plates 17, 17a.

We claim:

1. Transport device for substrates to be coated in a vacuum coating system with a substrate carrier plate removably attached to a support element of a base, the carrier plate being designed to hold at least one substrate, characterized in that the substrate carrier plate (17) is clamped to the support element (19) at least at one point by means of a centering pin (22, 23), which projects from the plane of the support element (19) and fits into a hole (24, 25) in the substrate carrier plate (17), and at least at one other point by means of a clamping device (18); in that the clamping device (18) is mounted on the base (2), on a control part (11), in such a way that it can move between a clamping position and a release position through the displacement of an actuating arm (21), the clamping device being provided with a tensioning roller (14), which is supported on a ramp (15) on the substrate carrier plate (17), the substrate carrier plate (17) having an opening (20) to allow the passage of the tensioning roller (14), the tensioning roller (14) being located behind this opening when in the release position; and in that the ramp (15) leads away from this opening (20) in the direction in which the tensioning roller (14) travels, the distance between the ramp and the opening (20) increasing with the distance from the support element (19).

2. Transport device according to claim 1, wherein the control part (11) is connected to a kickover spring (9), by means of which the control part (11), after overcoming an unstable intermediate position, is held under pretension in its clamping position or in its release position.

3. Transport device according to claim 2, wherein the kickover spring (9) is designed as a leaf spring, the two ends of which are supported in bearings (5, 6), which keep the spring bent into an arc.

4. Transport device according to claim 3 wherein each of the bearings (5, 6) has a V-block (7, 8), which holds the associated end of the kickover spring (9), which is designed in the form of a leaf spring.

5. Transport device according to claim 3 wherein one bearing (6) is installed so that it can move in the direction in which the kickover spring (9) extends and is held under pretension by a lateral-yield spring (10) in the main direction of the kickover spring (9).

6. Transport device according to claim 2 wherein the control part (11) is designed as a rocker arm, which rests on the kickover spring (9) near one end of the spring (9), and in that a support plate (12) is screwed to the rocker arm from the opposite side of the kickover spring (9) to grip the kickover spring (9).

7. Transport device according to claim 3 wherein the bearings (5, 6) are designed as separate components which can be inserted into the base (2).

8. Transport device according to claim 1 wherein characterized in that the opening (20) and the ramp (15) are provided on a tensioning element (16), which is inserted into the substrate carrier plate (17) and which is provided with a retaining flange.

9. Transport device according to claim 1 comprising a support element (19, 19a) with a removable substrate carrier plate (17, 17a), a centering pin (22, 22a; 23, 23a), and a clamping device (18, 18a) on each of two opposite sides in a symmetrical arrangement.

10. Transport device according to claim 9, wherein between the two support elements (19, 19a) on the base (2), a single control part (11), held by a kickover spring (9), is provided; and the control part (11) has a clamping yoke (11) with a tensioning roller (14, 14a), which moves along the associated ramp (15, 15a) on the outside surface of each substrate carrier plate (17, 17a).

11. Transport device according to claim 10, wherein the kickover spring (9) and the control part (11) are aligned with the longitudinal direction of the transport device (1), and the actuating arm (21) points in or opposite the direction of travel as it shifts the control part (11).

12. Transport device according to claim 1 wherein a base (2), which carries the support elements (19, 19a), the tensioning element (18, 18a), and the associated parts, is attached to each end, the support elements (19, 19a) of one base (2) being permanently screwed to the transport device (1), whereas the support elements of the other base are held by slots in the bases so that they can slide relative to the transport device in the longitudinal direction.

13. Apparatus for transporting substrates to be coated in a vacuum coating system, said apparatus comprising
a base,
a support element fixed to said base, said support element having a face with at least one centering pin projecting from said face,
a substrate carrier plate having at least one hole which receives said at least one pin, an opening, and a ramp adjacent to said opening, and
a control part comprising an actuating arm and a tensioning roller, said actuating arm being movable with respect to said base between a release position and a clamping position by displacing said actuating arm, said tensioning roller being located behind said opening when said control part is in the release position, said tensioning roller moving up said ramp to draw said substrate carrier plate toward said face of said support element when said pin is aligned with said hole and said control part is moved from said release position to said clamping position.

14. Apparatus as in claim 13 further comprising a kickover Spring to which said control part is attached, said kickover spring being held under tension in said clamping position and said release position, said spring being unstable between said positions.

15. Apparatus as in claim 14 wherein said kickover spring is a leaf spring having opposed ends supported in bearings, said apparatus further comprising a lateral yield spring to which one of said bearings is fixed.

16. Apparatus as in claim 13 comprising two said support elements fixed to said base, and two said substrate carrier plates symmetrically arranged with respect to said support elements, said control part comprising two said tensioning rollers which move on respective said ramps to draw said plates toward the faces of said support elements as said actuating arm is displaced to move said control part from said release position to said clamping position.

17. Apparatus as in claim 16 wherein said actuating arm is symmetrically arranged between said support elements.

* * * * *